(12) United States Patent
Li et al.

(10) Patent No.: US 12,513,911 B2
(45) Date of Patent: Dec. 30, 2025

(54) FERROELECTRICALLY MODULATED SPIN ORBIT LOGIC DEVICE

(71) Applicant: Intel Corporation, Santa Clara, CA (US)

(72) Inventors: Hai Li, Portland, OR (US); Dmitri Evgenievich Nikonov, Beaverton, OR (US); Chia-Ching Lin, Portland, OR (US); Tanay A Gosavi, Portland, OR (US); Ian Alexander Young, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 967 days.

(21) Appl. No.: 17/469,320

(22) Filed: Sep. 8, 2021

(65) Prior Publication Data

US 2023/0077177 A1    Mar. 9, 2023

(51) Int. Cl.
| | | |
|---|---|---|
| *H10B 61/00* | (2023.01) | |
| *H01L 25/10* | (2006.01) | |
| *H10N 50/85* | (2023.01) | |
| *H10N 52/00* | (2023.01) | |
| *H03K 19/18* | (2006.01) | |
| *H03K 19/185* | (2006.01) | |

(52) U.S. Cl.
CPC ........... *H10B 61/00* (2023.02); *H01L 25/105* (2013.01); *H10N 50/85* (2023.02); *H10N 52/101* (2023.02); *H03K 19/18* (2013.01); *H03K 19/185* (2013.01)

(58) Field of Classification Search
CPC ...... H10B 61/00; H01L 25/105; H10N 50/85; H10N 52/101; H10N 50/20; H10N 59/00; H03K 19/18; H03K 19/185
See application file for complete search history.

(56) References Cited

U.S. PATENT DOCUMENTS

| | | |
|---|---|---|
| 10,062,731 B2 | 8/2018 | Manipatruni et al. |
| 10,957,844 B2 | 3/2021 | Chawla et al. |
| 11,038,099 B2 | 6/2021 | Manipatruni et al. |
| 2019/0325932 A1 | 10/2019 | Manipatruni et al. |
| 2019/0386662 A1 | 12/2019 | Lin et al. |
| 2020/0134419 A1* | 4/2020 | Manipatruni .......... H10N 50/80 |

OTHER PUBLICATIONS

Manipatruni, Sasikanth, et al., "Scalable Energy-Efficient Magnetoelectric Spin-Orbit Logic," Nature, Springer Nature Limited (2018) (9 pages).

* cited by examiner

*Primary Examiner* — Thanh Y. Tran
(74) *Attorney, Agent, or Firm* — Alliance IP, LLC

(57) ABSTRACT

A spin orbit logic (SOL) device includes a first electrically conductive layer; a layer comprising a ferroelectric material (FE layer) on the first electrically conductive layer; a second electrically conductive layer on the FE layer; and a spin orbit coupling (SOC) stack including a first layer (SOC1 layer) including a first SOC material, and a second layer (SOC2 layer) including a second SOC material, the SOC1 layer adjacent the FE layer.

24 Claims, 7 Drawing Sheets

FERROELECTRICALLY MODULATED SPIN ORBIT LOGIC DEVICE

TECHNICAL FIELD

This disclosure relates generally to spin orbit coupling devices.

BACKGROUND

Spintronics is the study of intrinsic spin of the electron in solid-state devices. Spintronic logic are integrated circuit devices that use a physical variable of spin as a computation variable. Such variables can be non-volatile (i.e., preserving a computation state when the power to an integrated circuit is switched off). Non-volatile logic can improve the power and computational efficiency by allowing architects to put a processor to un-powered sleep states more often and therefore reduce energy consumption. Existing spintronic logic generally suffer from relatively long switching times and are complicated to manufacture.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DESCRIPTION OF EMBODIMENTS

Figure 1:
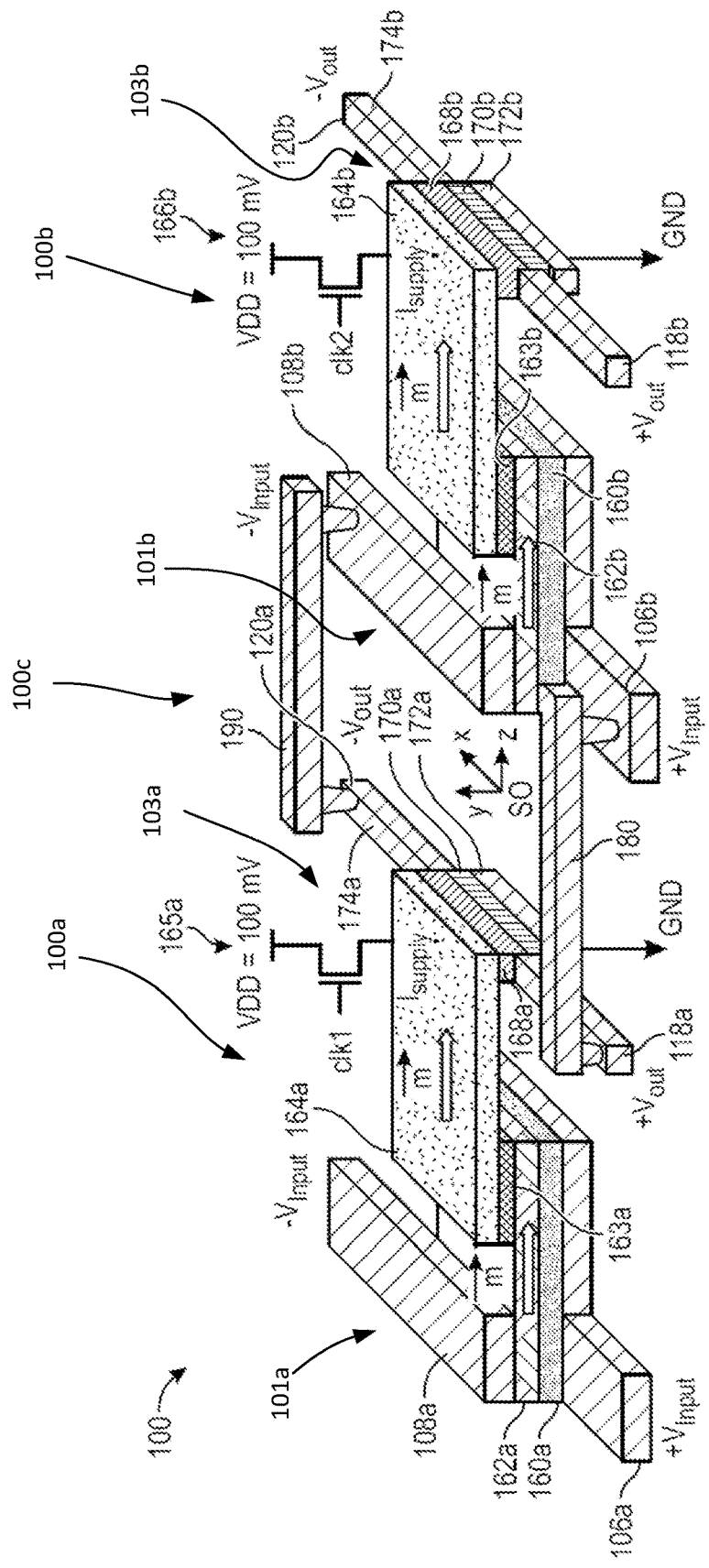
FIG. 1 illustrates a perspective view of a prior art logic circuit, two cascaded magneto-electric spin-orbit (MESO) inverters.

Some embodiments provide a spin orbit logic (SOL) device that includes a first electrically conductive layer; a layer comprising a ferroelectric material (FE layer) on the first electrically conductive layer; a second electrically conductive layer on the FE layer; and a spin orbit coupling (SOC) stack including a first layer (SOC1 layer) including a first SOC material, and a second layer (SOC2 layer) including a second SOC material, the SOC1 layer adjacent the FE layer.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Some embodiments provide an integrated circuit structure that includes a spin orbit logic SOL device in which a material whose state modulates or influences an output spin orbit (SO) charge current of the SOL circuit is ferroelectric rather than ferromagnetic. In this manner, embodiments advantageously open up a plethora of choices of ferroelectric materials to be used in SOL devices, as opposed to state of the art SOL devices that function based on multiferroic materials combined with ferromagnetic materials. The latter does not present as many options in terms of types and availability of materials. In addition, according to some embodiments, a SOL device operates faster than a ferromagnetically switched spin orbit logic device, and is further simpler and less expensive to manufacture.

FIG. 1 illustrates an integrated circuit structure 100 including cascaded magnetoelectric spin orbit logic (MESO) circuit including a set of MESO devices 100a and 100b connected to one another in a cascaded fashion. An integrated circuit device assembly may include one or more of the integrated circuit structures of FIG. 1, and may further include a number of such MESO circuits cascaded with one another in the same manner as shown in FIG. 1. The shown devices may be structurally identical to one another, and electrically connected by way of a non-magnetic electrical conductor bridge 100c including non-magnetic electrical conductors 180 and 190. The description provided below will therefore relate to either of MESO device 100a or 100b, and/or to their respective components, by referring to the same in the alternative as, for example, MESO device 100a/100b. In addition, in the description of FIG. 1, "vertical" refers to the "y" direction, and "horizontal" refers to the "x" direction or the "z" direction, which directions are shown by way of the coordinate system provided in FIG. 1.

MESO device 100a/100b includes a magnetoelectric (ME) capacitor region 101a/101b, and a spin orbit module (SOM) region 103a/103b magnetically coupled together. The ME capacitor region 101a/101b includes two non-magnetic electrical conductors 106a/106b (which is to provide a positive input bias or voltage, $V_{in}+$) and 108a/108b (which is to provide a negative input bias or voltage, $V_{in}$-), between which are provided a layer including a multiferroic material (MF layer) 160a/160b connected to $V_{in}$-, and a layer including a first ferromagnetic material (FM layer) 162a/162b.

The ME capacitor 101a/101b may be charged and discharged by virtue of the bias applied between $V_{in}$+ and $V_{in}$-. A charging and discharging of the ME capacitor region corresponds to a change in the information state of the ME capacitor. The ME capacitor region 101a/101b is coupled to the SOM 103a/103b by way of a non-magnetic electrical conductor structure including non-magnetic electrical conductors 180 and 190.

SOM 103a/103b includes a second FM layer 164a/164b disposed directly on a spin orbit coupling stack (SOC stack) including spin coherent layer 168a/168b and spin orbital coupling layer 170a/170b. Spin coherent layer 168a/168b, which in turn is disposed directly on a spin orbital coupling layer 170a in contact with a SOM non-magnetic electrical conductor 172a. SOM 103a/103b provides a structure that, when subjected to a supply current $I_{supply}$ supplied by way of a transistor, such as the N-type Metal-Oxide-Semiconductor Field-Effect (NMOS) transistor 166a/166b, first converts the supply current $I_{supply}$ to a spin current by virtue of $I_{supply}$ contacting second FM layer 164a, and thereafter converts the spin current to an output supply current flowing horizontally in the positive or negative x direction depending on the magnetization direction of second FM layer 164a. Output charge current $I_{output}$ of MESO device 100a generates a bias between $V_{in}$- and $V_{in}$+ of cascaded MESO device 100b as shown.

Second FM layer 164a is coupled to the first FM layer 162a by virtue of a coupling layer 163a. Coupling layer may include one or more of $Fe_3O_4$, $CoFe_2O_4$, $EuO$, $Fe_2O_3$, $Co_2O_3$, $Co_2FeO_4$, $Ni_2FeO_4$, $(Ni,Co)_{1+2x}Ti1-xO_3$, yttrium iron garnet $(YIG)=Y_3Fe_5O_{12}$, $(MgAl_{0.5}Fe_{1.5}O_4, MAFO)$, or $(NiAFO, NiAl_xFe_{2-x}O_4)$. The coupling layer is to electrically insulate the ME capacitor from the SOM (especially because of separate clocking of cascaded MESO devices as suggested for example by first and second clocking signals clk1 and clk2) while providing magnetic coupling between the first FM layer 162a and the second FM layer 164a. Coupling layer 163a serves to isolate the ME capacitor from the SO module electrically, esp. because of separately clocking of the MESO devices as noted above.

Transistor 166a/166b, clocked using a clock signal clk1/clk2 at its gate, is to provide the supply current $I_{supply}$ by virtue of a bias between $V_{dd}$ and Ground (Gnd) as shown. $I_{supply}$ is supplied vertically, in the minus y direction, to second FM layer 164a/164b. $I_{supply}$ will have no spin polarization before reaching the second FM layer. By virtue of contacting the second FM layer however, a spin current is generated from the supply current, the spin current having a spin direction based on a magnetization direction in the second FM layer. In FIG. 1, magnetization direction is shown by way of arrows denoted "m." The spin current will pass through the spin coherent layer 168a/168b and reach the interface between the spin coherent layer 168a/168b and the spin orbital coupling (SO coupling) layer 170a/170b. At the latter interface, the spin current will be converted into the output/spin orbital (SO) charge current $I_c$ as shown. The SO charge current $I_c$ flow creates a bias $V_{out}$+ at contact 118a and a bias $V_{out}$- at contact 120a.

Because of the magnetic coupling provided by the coupling layer 163a/163b, first FM layer 162a/162b and second FM layer 164a/164b will have magnetization directions that are the same when a bias is applied to the ME capacitor 100a/100b. The direction of magnetization m, in the shown configuration, will be in the negative or positive z direction, since, in general, and unless other factors are at play, a magnetization direction in an object tends to be along a direction corresponding to a longest dimension of the object, in the shown case, in the z direction. When the magnetization direction m is changed, the functionality of the SO module is changed as well. As a result, with a change in the direction of magnetization of BML and TML, the direction of the SO charge current $I_c$ can change as well. Therefore, changing the ME capacitor state will change the direction of the SO charge current $I_c$.

SO module 103a/103b operates based on spintronic phenomena, including a spin hall effect (SHE) and/or a Rashba-Edelstein effect (including inverses of each of the latter effects). SHE is based on the use of heavy metals to convert a spin current into a charge current, and vice versa in the inverse case.

Referring to the SO module 103a/103b, in the case of inverse SHE, $I_{supply}$ going into the second FM layer 164a/164b will polarize the electrons of the supply current $I_{supply}$ and generate a spin polarized current therefrom, where the spin movement of the electrons is based on a the direction of magnetization m. Therefore, the SOM 103a/103b is configured to convert the magnetization state of the FM layers into a SO charge current L.

$I_c$ can serve to charge a capacitor in the next cascaded MESO device by virtue of the generation of a voltage bias between contacts 118a and 120a as shown. Furthermore, it is to be understood that each of the MESO device shown, including 100b, can be used to charge a ME capacitor similar to ME capacitor 101a/101b at the next cascaded MESO device by virtue of the SO charge current $I_c$ that it may generate and the resultant output voltage bias (e.g. at contacts 118b and 120b of MESO device 100b) at its output to form the logic circuit or part of a logic circuit, as shown in FIG. 1.

Since electricity travels much faster than spin, converting a magnetization state of ME capacitor 101a/101b into an ultimate SO charge current will transmit a signal representing the state of the ME capacitor (and this information contained in the same) much faster than would be transmitted by virtue of spin alone.

In heavy metals used in devices that operate based on the SHE principle, efficiency of conversion may, as is known today, be between about 10% to about 30%. For example, for a supply current $I_{supply}$ of 10 microamps, one may obtain 3 micro amps of SO charge current for the ME capacitor of the next cascaded MESO device.

The MESO device 100a/100b presents a source of inefficiency based on the coupling between the ME capacitor 101a/101b and the SOM 103a/103b of the same device 100a/100b, by virtue of the coupling layer 163a/163b may not be 100% efficient.

Figure 2:
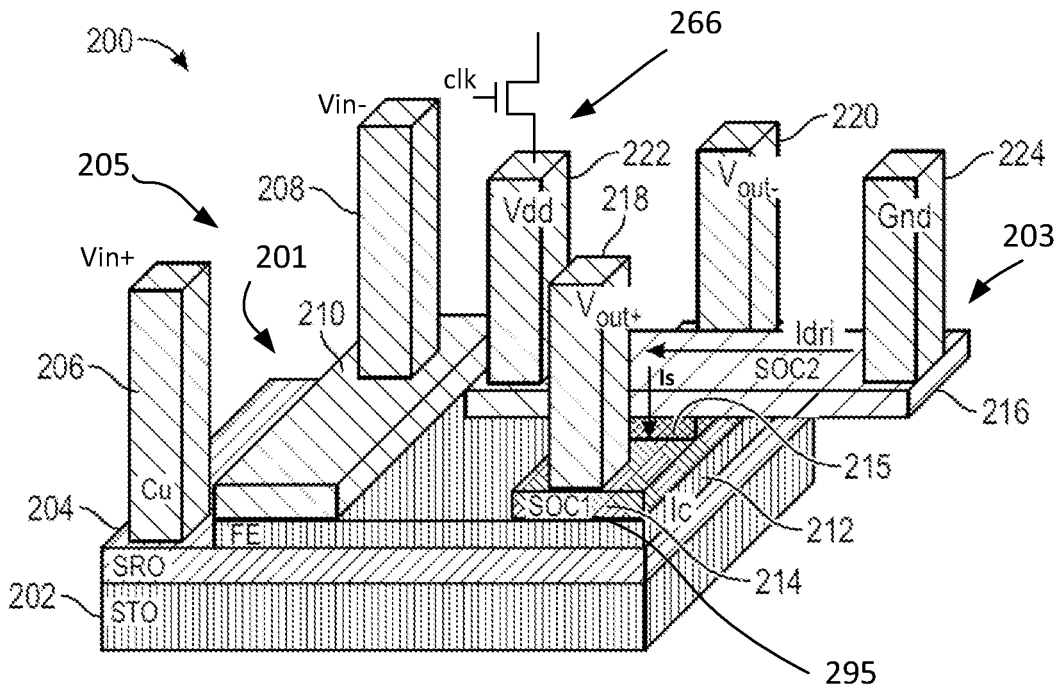
FIG. 2 illustrates a perspective view of an electric spin orbit logic (ESOL) inverter device in accordance with an embodiment.

FIG. 2 illustrates an integrated circuit structure 200 including an electric spin orbit logic device (ESOL) device 205 according to some embodiments. An integrated circuit structure according to one example embodiment may include the ESOL device of FIG. 2, and may further include a number of such ESOL devices together forming a circuit similar to the one included in FIG. 3 to be described below.

ESOL device 200 may be configured to be electrically connected by way of a non-magnetic electrical conductor bridge to another similar or identical device in a cascaded fashion, as will be explained in further detail in the context of FIG. 3. In the description of FIG. 2, "vertical" refers to the "y" direction, and "horizontal" refers to the "x" direction or the "z" direction, which directions are shown by way of the coordinate system provided in FIG. 2.

ESOL device 200 includes a ferroelectric (FE) capacitor 201, and a spin orbit module (SOM) region 203 coupled together by virtue of an interface 295 between a layer of capacitor 201 including a ferroelectric (FE) material (FE layer) 212 and a first layer including a spin orbit coupling (SOC) material (SOC1 layer) 214 at the SOM region 203. The FE layer 212 may include a material such as at least one of $BiFeO_3$, $BaTiO_3$, $Pb[Zr_xTi1-x]O_3$, $LuFeO_3$, or HfZrOx. The FE capacitor 201 includes the FE layer 212, a negative electrode layer 210 that is connected to a negative input contact $V_{in}-$ 208, and a positive electrode layer that corresponds to a layer including $SrRuO_3$ (SRO layer) 204. SRO layer 204 is connected to a positive input $V_{in}+$ conductive structure 206. Contacts $V_{in}+$ and $V_{in}-$ are to provide a bias differential at each side of the FE layer 212. SRO layer 204 may be grown epitaxially onto a layer including silicon (Si) substrate buffered by SrTiO3 (STO) layer 202. since the FE material choice is greatly increased by embodiments, the bottom electrode including the SRO/STO layers can be replaced by many other material substrates or conducting materials compatible with various FE materials. The SRO layer or STO layer may include, for example, at least one of SrRuO3, SrVO3, SrCrO3, SrFeO3, ReO3, NaWO3, KMoO3, SrNbO3, LaTiO3, LaWO3. Non-stoichiometric as well as doped materials are also possible.

The FE capacitor 201 may be charged and discharged by virtue of the bias applied between $V_{in}+$ and $V_{in}-$. A charging and discharging of the FE capacitor corresponds to a change in the information state of the FE capacitor by virtue of a change in electric polarization within the FE material of FE layer 212. The FE capacitor 201 is coupled to the SOM 203 by way of an interface between FE layer 212 and SOC1 layer 214, where FE layer 212 and SOC1 layer 214 are coupled to one another such that an electric polarization direction of the FE layer 212 affects a direction of current flow $I_c$ within the SOC1 layer as will be explained further below.

SOM 203 in turn includes a spin orbit coupling stack (SOC stack) that in turn comprises a first layer including a SOC material (SOC1 layer) 214, a second layer including a SOC material (SOC2 layer) 216, and a layer including a material to serve as a tunnel barrier (TB layer) 215, such as MgO or AlOx, or the like, between SOC1 layer 214 and SOC2 layer 216. Any of the SOC1 layer or SOC2 layer may include any of: a metal, such as W, Ta, or Pt; topological insulators such as $Bi_2Se_3$, $Bi_2Te_3$, BiSb; or materials containing 2-dimensional electron gas e.g. LaAlO3/SrTiO3 or Al/KTaO3 interfaces.

As used herein, a "SOC material" is a material that has a spin Hall effect coefficient.

In some embodiments, either of SOC1 layer or SOC2 layer may comprise one or more layers. For example, either of SOC1 layer or SOC2 layer may comprise a SOC material, or a hetero-structure, which is characterized by being able to provide a Spin Hall effect or an inverse Spin Hall effect (SHE or inverse SHE). In some embodiments, either of SOC1 layer or SOC2 layer may comprise two-dimensional materials (2D) with spin orbit interaction. According to some embodiments, the first SOC material and the second SOC material are different from one another. According to some other embodiments, the first SOC material and the second SOC material are identical to one another.

In some embodiments, the 2D materials may be selected from a group consisting of: Graphene, $MoS_2$, $WSe_2$, $WS_2$, and $MoSe_2$ In some embodiments, the 2D materials include an absorbent selected from a group consisting of: Cu, Ag, Pt, Bi, Fr, and H absorbents.

In some embodiments, either of SOC1 layer or SOC2 layer may include materials $ROCh_2$, where 'R' is selected from a group consisting of: La, Ce, Pr, Nd, Sr, Sc, Ga, Al, and In, and where "Ch" is a chalcogenide selected from a group consisting of S, Se, and Te.

In some embodiments, either of SOC1 layer or SOC2 layer may include one or more material that form a hetero-structure with Cu, Ag, Al, and Au.

In some embodiments, either of SOC1 layer or SOC2 layer comprises a material selected from a group consisting of: β-Ta, β-W, W, Pt, Cu doped with Iridium, Cu doped with Bismuth, and Cu doped an element of 3d, 4d, 5d, 4f, or 5f of periodic table groups.

In some embodiments, either of SOC1 layer or SOC2 layer may include any combination of one or more layers of the materials described above in the context of SOC layers.

Any of the SOC1 layer and SOC2 layer may include one layer or multiple layers. The FE layer or TB layer may include a single layer. The FE layer may for example have a thickness of about 10 nm or less. The TB layer may be a few nm thicker than the FE layer. The layers do not have to have a rectangular cross section, and may have any cross section. For example, they can have rounded corners with similar functionality to that for rectangular cross sections.

In some embodiments, the spin-orbit mechanism responsible for spin-to-charge current conversion, such as that implemented by way of example spin orbit stack including layers 168a, 170a and 172a of FIG. 1, or such as that exhibited by SOC1 layer 214 of FIG. 2 described herein, is referred to as the inverse Spin Hall effect in a 2D electron gases.

For example, referring first to FIG. 2 and SOC2 layer 216, positive current $I_{dri}$ along the −z direction produces a spin injection current $I_s$ with transport direction for the spin along the −y direction and spins pointing to the +y direction, as expressed in Equation (1) below.

$$\widehat{I_s} = \theta \cdot \widehat{I_{dri}} \cdot \hat{\sigma} \qquad \text{Eq. (1)}$$

where θ is the spin Hall angle, and σ is the spin operator, which stands for spin polarization, a unitless quantity.

The above results in the generation of charge current $I_c$ in SOC1 layer 214 proportional to the spin current $I_s$ (the propagation of the spin without charge flow).

The spin-orbit interaction at an interface between SOC1 layer and SOC2 layer is brought about by the inverse Rashba-Edelstein Effect (IREE)) as referred to above (inverse SHE), producing a charge current $I_c$ in the horizontal direction given as:

$$\widehat{I_c} = \theta \cdot \widehat{I_s} \cdot \hat{\sigma} \qquad \text{Eq. (3)}$$

A mechanism of embodiments is to use the local electrical field generated by FE at the FE/SOC1 interface. This local electrical field will change the sign of θ, so that the current directionality of Ic will change based on the FE polarization state.

Referring still to FIG. 2, the TB layer 215 may include one or more layers of a dielectric oxide material, such as manganese oxide MgO, which is good at preserving the spin polarization, although other materials, such as, for example, aluminum oxide AlO and silicon oxide SiO work as well. TB layer 215 may be in direct contact with SOC1 layer 214 at one side thereof, and with SOC2 layer at another side thereof. A role of TB layer 215 is to provide electrical isolation between SOC1 layer 214 and SOC2 layer 215.

SOC1 layer 214 is coupled at one end thereof to a positive output contact $V_{out}$+218, and at another end thereof to a negative output contact $V_{out}$− 220. $V_{out}$− and $V_{out}$+ in FIG. 2 may correspond to the $V_{out}$− 120a and $V_{out}$+ 118a of FIG. 1 that may be connected to another ESOL device similar to ESOL device 200 by virtue of a bridge similar to bridge 100c of FIG. 1 as will be described in further detail in connection with FIG. 3 below.

SOM 203 provides a structure that, when subjected to a drive/supply current $I_{dri}$, for example supplied by way of a transistor, such as the N-type Metal-Oxide-Semiconductor Field-Effect (NMOS) transistor 266 similar to NMOS transistor 166a of FIG. 1, first converts the supply current Ian to a spin current $I_s$ by virtue of $I_{supply}$ contacting SOC2 layer 216, and thereafter converts the spin current $I_s$ to an output supply current $I_c$ flowing horizontally in the positive or negative x direction in SOC2 layer 214 depending on the electric polarization direction within FE layer 212. Output charge current $I_c$ of ESOL device 200 generates a bias between $V_{out}$+ and $V_{out}$− and results in a similar bias in a cascaded ESOL device as will be explained in the context of FIG. 3 below.

Transistor 266, clocked using a clock signal clk at its gate, is to provide the drive current Ian by virtue of a bias between $V_{dd}$ at $V_{dd}$ conductive structure 222 and Ground (Gnd) at Gnd conductive structure 224 as shown. As shown Ian is supplied horizontally along SOC2 layer 216 between Gnd conductive structure 224 and $V_{dd}$ conductive structure 222, in the minus z direction although embodiments are not so limited and the Gnd and $V_{dd}$ contacts could be switched in their positions to have Ian flow in the plus z direction. By virtue of contacting the SOC2 layer 216, a spin current $I_s$ is generated from Ian, the spin current $I_s$ having a spin direction as dictated by the SOC2 layer 216. Spin current $I_s$ will pass through the TB layer 215, and reach the interface 295 between the FE layer 212 and the SOC1 layer 214. At the latter interface, the spin current will be converted into the output/spin orbital (SO) charge current $I_c$ as shown.

The direction of electric polarization in the FE layer 212 (controlled by the polarity of voltage (delta of Vin+ and Vin− across the FE layer) in the plus or minus y direction) will change the functionality of the SOM 203 by affecting the direction of flow of $I_c$ within SOC1 layer. The direction of electric polarization in the FE layer 212 specifically influences the functionality of SOC1 layer 214 by virtue of the interface 295 between FE layer 212 and SOC1 layer 214, while SOC2 layer 216 is insulated from the direction of electric polarization in the FE layer 212 by virtue of TB layer 215. As a result, with a change in the direction of electric polarization of FE layer 212, the direction of the SO charge current $I_c$ can change as well. Therefore, changing the FE capacitor state will change the direction of the SO charge current $I_c$.

While, in the embodiment of FIG. 1, the bias between $V_{in}$− and $V_{in}$+ would polarize the magnetic properties of the MF layer 160a, which in turn would affect the magnetization direction of the FM layers 162a and 164a, in the embodiment of FIG. 2, we do away with a multiferroic layer, the two FM layers 162a and 164a, and the coupling layer 163a therebetween, Instead, using FE capacitor 201, we polarize the FE layer 212 instead, without using a manipulation of magnetization direction in a FM layer. The electric field, as reflected in the direction of electric polarization in FE layer 121, would impinge on interface 295 with SOC1 layer 214, and influence/change the spin orbit coupling effect of the SOC1 material. Therefore, the embodiment of FIG. 2 involves spintronics without magnetics.

With the ESOL device 200 of FIG. 2, if one generates the drive current Ian in one direction on a surface of SOC2 layer 216, by virtue of spintronics and based on the SHE effect, electron spin polarization accumulates at a surface of SOC2 layer 216, and propagates past this surface, as shown by spin polarized current $I_s$, where a majority of the carriers are spin polarized. Therefore a flow of spins takes place corresponding to a propagation of the spin, with substantially no net charge going across the interface between SOC2 layer 216 and SOC1 layer 214.

The spin polarized current $I_s$ then brings about a spin to charge conversation by virtue SOC1 layer 214 and an inverse SHE, which results in the SO charge current $I_c$ as shown, where a direction of $I_c$ is affected by the direction of electric polarization of the FE layer 212 as noted above, instead of by a magnetization direction as was the case in the MESO structure 100 of FIG. 1.

A SOC material is characterized in part of its coefficient of coupling (COC) designated by theta θ, which quantifies the amount and direction (COC has a + or − sign to denote direction) of spin polarized current one may be able to generate, by virtue of the SOC material, from each unit of charge current. In the example embodiment of FIG. 2, while the theta of the SOC2 layer 216 remains unchanged (in part because of the electrical decoupling provided by TB layer 215), the direction of (sign of) theta of SOC1 is changed by the direction of electric polarization of FE.

We expect that the θ of SOC1 will only change its sign by FE polarization. The amount/degree of FE polarization change may however also change the absolute value of θ. One may, for example, control the amount of bias applied at the capacitor to bring about a certain amount of polarization of the FE layer to bring about a certain amount of output charge current between $V_{out}$+ and $V_{out}$−.

The direction of electric polarization of FE changes a direction of a triangular quantum well at the interface 295 between FE layer 295 and SOC1 layer 214 and therefore the polarization of the spin coupling in SOC1 layer 214. The TB layer 215 electrically decouples SOC2 layer 216 from SOC1 layer 214 and hence suppresses effects of the direction of electric polarization within the FE layer 212 onto SOC2 layer 216, while also suppressing effects of Ian flowing within SOC2 layer 216 on SOC1 layer 214. The direction of electric polarization in the FE layer 212 will change the functionality of the SOM 203 by affecting the direction of flow of $I_c$ within SOC1 layer. The direction of electric polarization in the FE layer 212 specifically influences the functionality of SOC1 layer 214 by virtue of the interface 295 between FE layer 212 and SOC1 layer 214, while SOC2 layer 216 is insulated from the direction of electric polarization in the FE layer 212 by virtue of TB layer 215. As a result, with a change in the direction of electric polarization of FE layer 212, the direction of the SO charge current $I_c$ can change as well. Therefore, changing the FE capacitor state will change the direction of the SO charge current $I_c$.

While, in FIG. 1, the layer that ultimately affects the direction of the SO charge current is a multiferroic layer 164a, in the embodiment of FIG. 2, the layer that ultimately affects the direction of the SO charge current is advantageously a ferroelectric layer. While multiferroic layer present limited choices of materials, ferroelectric layers advantageously present many more opportunities for readily available ranges of materials. Now with 212 we have much broader choices of a ferroelectric material. FE layer by virtue of its polarization up or down, at interface with SOC1, local charge of FE material can control the directionality of current in SOC1. $I_c$ can be this way or opposite way.

In some embodiments, such as those described above in FIG. 2, and to be described below in the context of FIG. 3, the contacts, electrodes, interconnects and non-magnetic conductors may be formed of non-magnetic metal (e.g., Cu, Ag, etc.).

A feature of embodiments is in an electrical control of an output charge current direction within a SOC layer in a spin orbit logic device, such as ESOL device 200 of FIG. 2, rather than a magnetic control of the same.

Advantageously, while, in FIG. 1, the layer that ultimately affects the direction of the SO charge current is a multiferroic layer 164a, in the embodiment of FIG. 2, the layer that ultimately affects the direction of the SO charge current is advantageously a ferroelectric layer. While choices in multiferroic materials are limited, ferroelectric layers advantageously present many more opportunities for readily available ranges of materials. Therefore, with embodiments as shown by way of example in FIG. 2, there are advantageously much broader choices of materials available for the dielectric portion (the portion between the capacitor electrodes). In addition, a structure of an ESOL device of embodiments, such as the exemplary structure of FIG. 2, advantageously provides a much simpler structure than that of the MESO device of FIG. 1, and is therefore easier and less costly to manufacture. In addition, a structure of an ESOL device of embodiments exhibits a faster operation than the MESO device of FIG. 1. A limit of a MESO structure such as the one of FIG. 1 is the time it takes for magnetization in the FM layers to rotate/switch by virtue of the bias between $V_{in}-$ and $V_{in}+$. The switching time may for example be in the order of ½ of a nanosecond, by virtue of the intrinsic nature of a FM material. A structure of an ESOL device of embodiments, such as the exemplary structure of FIG. 2, advantageously operates faster than a FM switches MESO device, among other things by virtue of eliminating the use of FM material layers to switch the SO charge current. In the ESOL device according to embodiments, a limiting factor for switching the direction of the output charge current is a time for the direction of electric polarization of the FE layer to switch, which may be in the order of only about 20 picoseconds.

Figure 3:
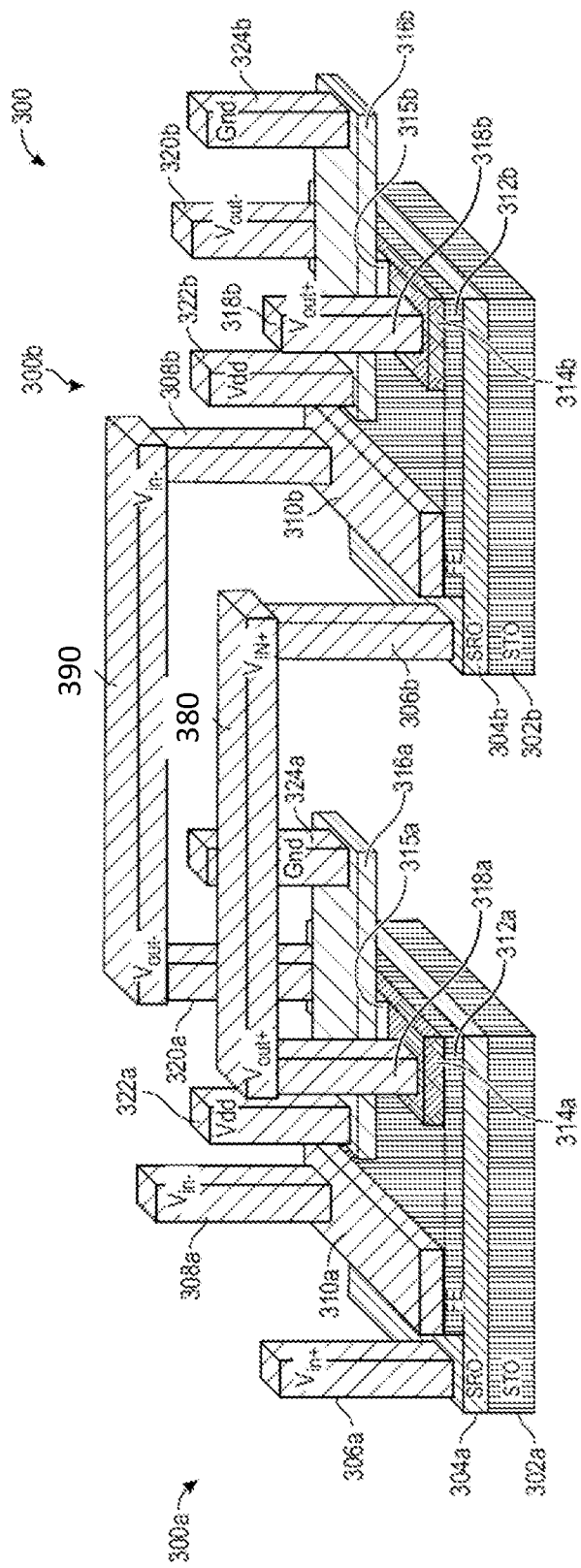
FIG. 3 illustrates a perspective view of a layout of cascaded electric spin orbit logic (ESOL) circuit including two cascaded ESOL inverters in accordance with an embodiment.

FIG. 3 illustrates an integrated circuit structure 300 including a cascaded ESOL logic circuit having a set of ESOL devices 300a and 300b electrically connected to one another in a cascaded fashion as shown. ESOL devices 300a and 300b, similar to the ESOL device 200 of FIG. 2, are connected to one another in a cascaded fashion as shown to form a logic circuit, or part of a logic circuit. The shown devices may, similar to the cascaded arrangement of FIG. 1, be structurally identical to one another, and electrically connected by way of a non-magnetic electrical conductor bridge 300c including non-magnetic electrical conductors 380 and 390. The description provided above regarding FIG. 2 will therefore relate to either of ESOL devices 300a or 300b of FIG. 3, and/or to their respective components, with the difference being that a component with a reference numeral "x" in FIG. 2 is denoted "xa" for ESOL device 300a of FIG. 3, and "xb" for ESOL device 300b of FIG. 3. In addition, in the description of FIG. 3, similar to that of FIGS. 1 and 2, "vertical" refers to the "y" direction, and "horizontal" refers to the "x" direction or the "z" direction, which directions are shown by way of the coordinate system provided in FIG. 3.

In FIG. 3, the charge current $I_c$ from ESOL device 300a (similar to ESOL device 200 of FIG. 2) may be carried by conductor bridge 300c in FIG. 3, which bridge includes conductors 380 and 390, similar to conductors 180 and 190 of bridge 100c of FIG. 1. $I_c$ can serve to charge a capacitor in the next cascaded ESOL device 300b by virtue of the generation of a voltage bias between contacts 318a and 320a as shown. Furthermore, it is to be understood that each of the ESOL device shown, including d00b, can be used to charge a capacitor similar to capacitor 201 of FIG. 2 at the next cascaded ESOL device by virtue of the SO charge current $I_c$ that it may generate and the resultant output voltage bias (e.g. at contacts 318b and 320b of ESOL device 300b) at its output to form the logic circuit or part of a logic circuit, as shown in FIG. 3.

Figure 4:
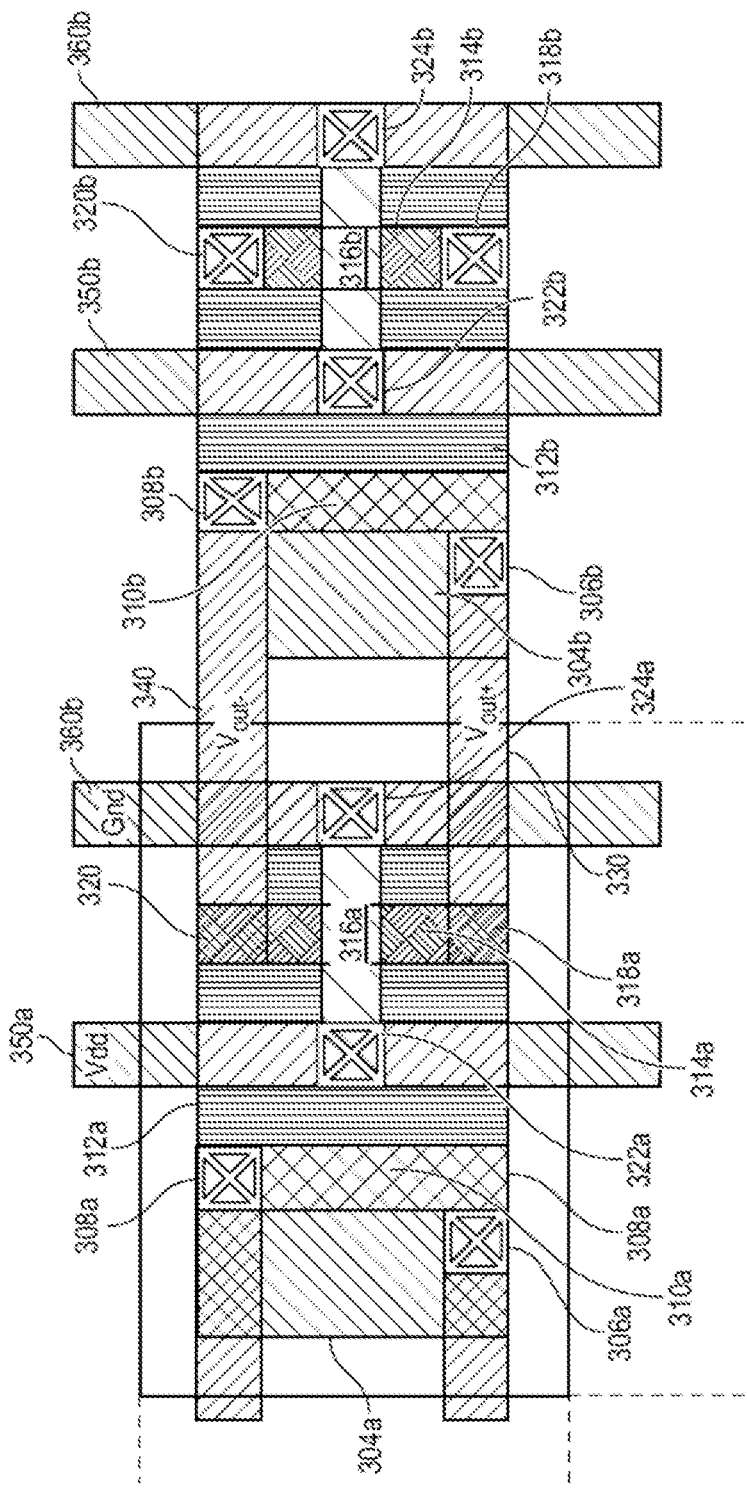
FIG. 4 illustrates a top view of a layout of the cascaded electric spin orbit logic (ESOL) circuit of FIG. 3.

FIG. 4 illustrates a top view of a layout 400 of the cascaded ESOL logic circuit similar to that of FIG. 3, according to some embodiments. It is pointed out that those elements of FIG. 3 having the same reference numbers (or names) as the elements of FIG. 3 can operate or function in any manner similar to that described, but are not limited to such. Power supply is provided via the voltage differential between interconnects 350a at Vdd and 360a at Gnd. Here, 306a/306b, 308a/308b, 318a/318b, 320a/320b, 322a/322b and/or 324a/324b may correspond to contact vias. The density of integration of the ESOL circuit devices described herein may exceed that of CMOS. In some embodiments, since a same power transistor may be shared among all the devices at the same clock phases, and as a result, vertical integration can be used to increase the logic density.

Figure 5:
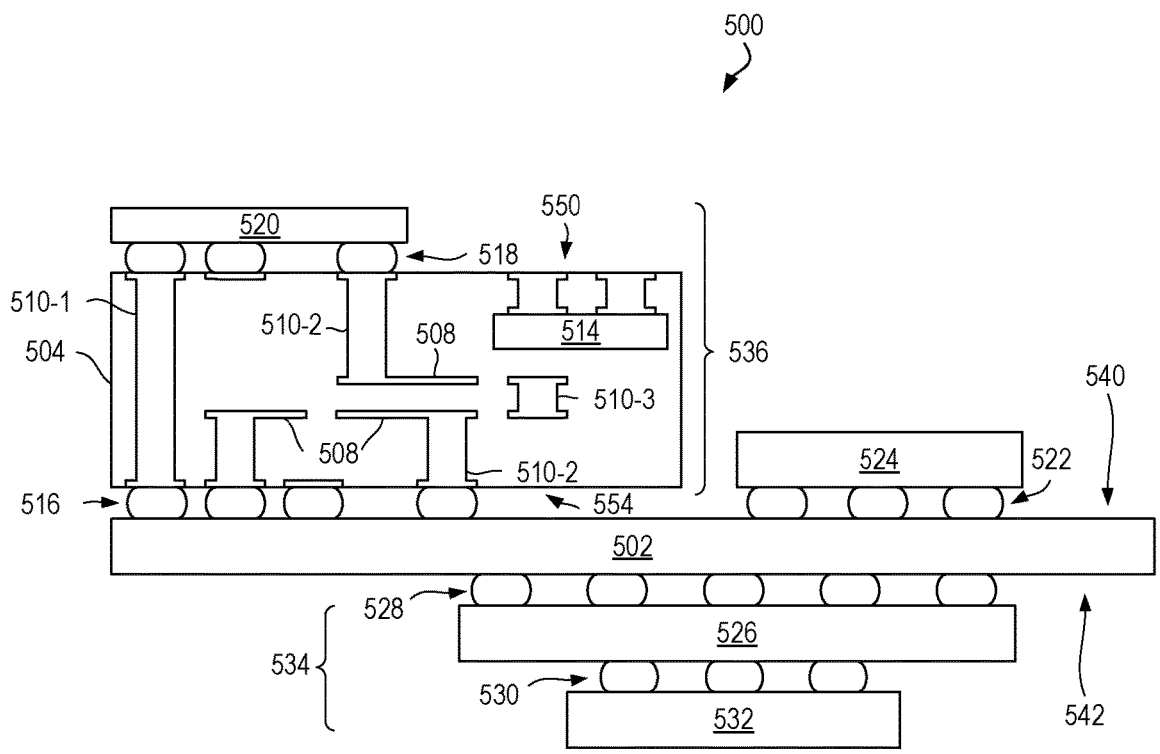
FIG. 5 is a cross-sectional side view of an integrated circuit device assembly that may include a cascaded ESOL circuit, in accordance with any of the embodiments disclosed herein.

FIG. 5 is a cross-sectional side view of an integrated circuit device assembly 500 that may include one or more integrated circuit structures each including any of the cascaded electric spin orbit logic (ESOL) circuits described herein. The integrated circuit device assembly 500 includes a number of components disposed on a circuit board 502 (which may be a motherboard, system board, mainboard, etc.). The integrated circuit device assembly 500 includes components disposed on a first face 540 of the circuit board 502 and an opposing second face 542 of the circuit board 502; generally, components may be disposed on one or both faces 540 and 542. Any of the integrated circuit components discussed below with reference to the integrated circuit device assembly 500 may include an integrated circuit structure including a cascaded ESOL circuit as disclosed herein.

In some embodiments, the circuit board 502 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 502. In other embodiments, the circuit board 502 may be a non-PCB substrate. The integrated circuit device assembly 500 illustrated in FIG. 5 includes a package-on-interposer structure 536 coupled to the first face 540 of the circuit board 502 by coupling components 516. The coupling components 516 may electrically and mechanically couple the package-on-interposer structure 536 to the circuit board 502, and may include solder balls (as shown in FIG. 5), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 536 may include an integrated circuit component 520 coupled to an interposer 504 by coupling components 518. The coupling components 518 may take any suitable form for the application, such as the forms discussed above with reference to the coupling components 516. Although a single integrated circuit component 520 is shown in FIG. 5, multiple integrated circuit components may be coupled to the interposer 504; indeed, additional interposers may be coupled to the interposer 504. The interposer 504 may provide an intervening substrate used to bridge the circuit board 502 and the integrated circuit component 520.

The integrated circuit component 520 may be a packaged or unpackaged integrated circuit product that includes one or more integrated circuit dies including cascaded ESOL circuits such as those shown in FIGS. 3 and 4. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 520, a single monolithic integrated circuit die comprises solder bumps attached to contacts on the die. The solder bumps allow the die to be directly attached to the interposer 504. The integrated circuit component 520 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 520 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 520 comprises multiple integrated circuit dies, the dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 520 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 504 may spread connections to a wider pitch or reroute a connection to a different connection. For example, the interposer 504 may couple the integrated circuit component 520 to a set of ball grid array (BGA) conductive contacts of the coupling components 516 for coupling to the circuit board 502. In the embodiment illustrated in FIG. 5, the integrated circuit component 520 and the circuit board 502 are attached to opposing sides of the interposer 504; in other embodiments, the integrated circuit component 520 and the circuit board 502 may be attached to a same side of the interposer 504. In some embodiments, three or more components may be interconnected by way of the interposer 504.

In some embodiments, the interposer 504 may be formed as a PCB, including multiple metal layers separated from one another by layers of dielectric material and interconnected by electrically conductive vias. In some embodiments, the interposer 504 may be formed of an epoxy resin, a fiberglass-reinforced epoxy resin, an epoxy resin with inorganic fillers, a ceramic material, or a polymer material such as polyimide. In some embodiments, the interposer 504 may be formed of alternate rigid or flexible materials that may include the same materials described above for use in a semiconductor substrate, such as silicon, germanium, and other group III-V and group IV materials. The interposer 504 may include metal interconnects 508 and vias 510, including but not limited to through hole vias 510-1 (that extend from a first face 550 of the interposer 504 to a second face 554 of the interposer 504), blind vias 510-2 (that extend from the first or second faces 550 or 554 of the interposer 504 to an internal metal layer), and buried vias 510-3 (that connect internal metal layers).

In some embodiments, the interposer 504 can comprise a silicon interposer. Through silicon vias (TSV) extending through the silicon interposer can connect connections on a first face of a silicon interposer to an opposing second face of the silicon interposer. In some embodiments, an interposer 504 comprising a silicon interposer can further comprise one or more routing layers to route connections on a first face of the interposer 504 to an opposing second face of the interposer 504.

The interposer 504 may further include embedded devices 514, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 504. The package-on-interposer structure 536 may take the form of any of the package-on-interposer structures known in the art. In embodiments where the interposer is a non-printed circuit board The integrated circuit device assembly 500 may include an integrated circuit component 524 coupled to the first face 540 of the circuit board 502 by coupling components 522. The coupling components 522 may take the form of any of the embodiments discussed above with reference to the coupling components 516, and the integrated circuit component 524 may take the form of any of the embodiments discussed above with reference to the integrated circuit component 520.

The integrated circuit device assembly 500 illustrated in FIG. 5 includes a package-on-package structure 534 coupled to the second face 542 of the circuit board 502 by coupling components 528. The package-on-package structure 534 may include an integrated circuit component 526 and an integrated circuit component 532 coupled together by coupling components 530 such that the integrated circuit component 526 is disposed between the circuit board 502 and the integrated circuit component 532. The coupling components 528 and 530 may take the form of any of the embodiments of the coupling components 516 discussed above, and the integrated circuit components 526 and 532 may take the form of any of the embodiments of the integrated circuit component 520 discussed above. The package-on-package structure 534 may be configured in accordance with any of the package-on-package structures known in the art.

Figure 6:
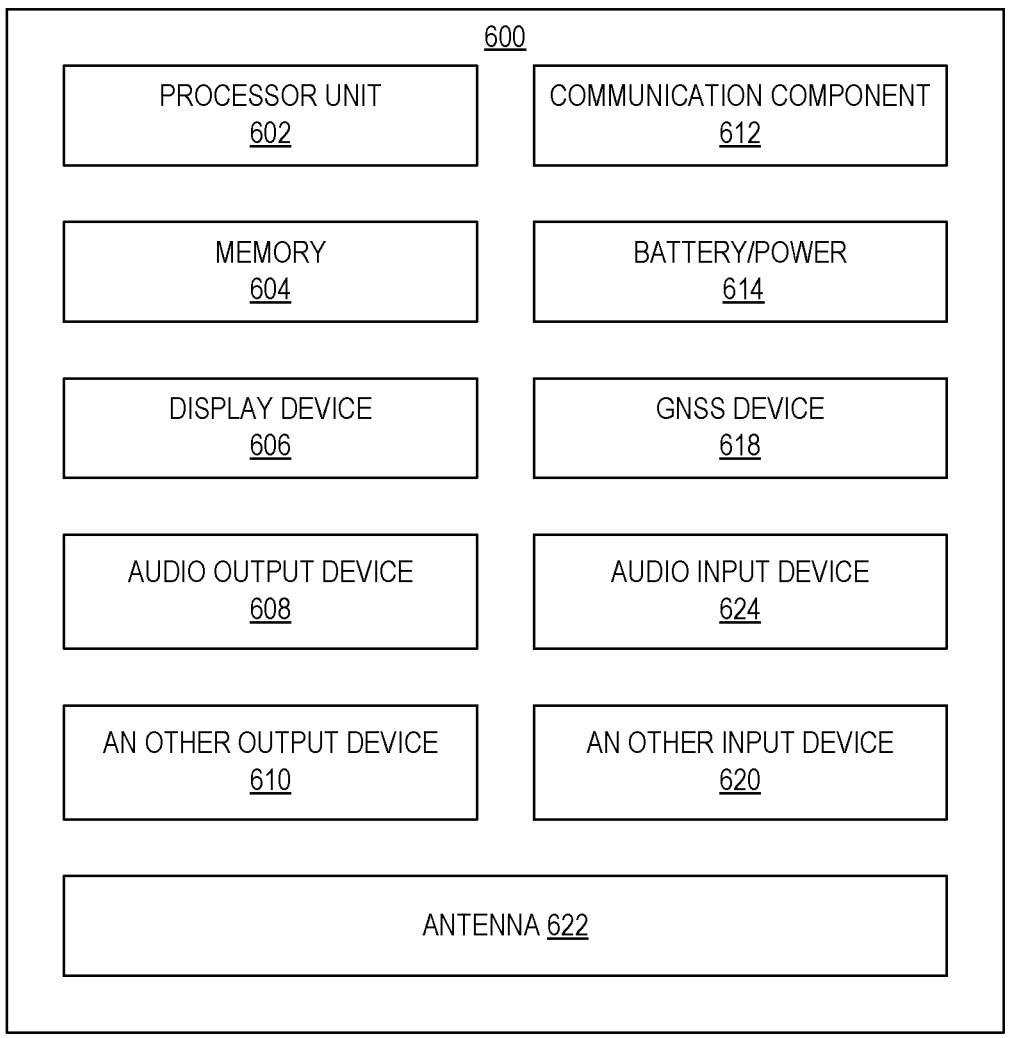
FIG. 6 is a block diagram of an example electrical device that may include a cascaded ESOL circuit, in accordance with any of the embodiments disclosed herein.

FIG. 6 is a block diagram of an example electrical device 600 that may include one or more of the ESOL circuits disclosed herein. For example, any suitable ones of the components of the electrical device 600 may include one or more of the integrated circuit device assemblies 500, integrated circuit components 520, and/or ESOL circuits 300 disclosed herein. A number of components are illustrated in FIG. 6 as included in the electrical device 600, but any one or more of these components may be omitted or duplicated, as suitable for the application. In some embodiments, some or all of the components included in the electrical device 600 may be attached to one or more motherboards mainboards, or system boards. In some embodiments, one or more of these components are fabricated onto a single system-on-a-chip (SoC) die.

Additionally, in various embodiments, the electrical device 600 may not include one or more of the components illustrated in FIG. 6, but the electrical device 600 may include interface circuitry for coupling to the one or more components. For example, the electrical device 600 may not include a display device 606, but may include display device interface circuitry (e.g., a connector and driver circuitry) to which a display device 606 may be coupled. In another set of examples, the electrical device 600 may not include an audio input device 624 or an audio output device 608, but may include audio input or output device interface circuitry (e.g., connectors and supporting circuitry) to which an audio input device 624 or audio output device 608 may be coupled.

The electrical device 600 may include one or more processor units 602 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 602 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 600 may include a memory 604, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 604 may include memory that is located on the same integrated circuit die as the processor unit 602. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 600 can comprise one or more processor units 602 that are heterogeneous or asymmetric to another processor unit 602 in the electrical device 600. There can be a variety of differences between the processing units 602 in a system in terms of a spectrum of metrics of merit including architectural, microarchitectural, thermal, power consumption characteristics, and the like. These differences can effectively manifest themselves as asymmetry and heterogeneity among the processor units 602 in the electrical device 600.

In some embodiments, the electrical device 600 may include a communication component 612 (e.g., one or more communication components). For example, the communication component 612 can manage wireless communications for the transfer of data to and from the electrical device 600. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 612 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 612 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 612 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 612 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 612 may operate in accordance with other wireless protocols in other embodiments. The electrical device 600 may include one or more antennas, such as antenna 622 to facilitate wireless communications and/or to receive other wireless communications (such as AM or FM radio transmissions).

In some embodiments, the communication component 612 may manage wired communications, such as electrical, optical, or any other suitable communication protocols (e.g., IEEE 802.3 Ethernet standards). As noted above, the communication component 612 may include multiple communication components. For instance, a first communication component 612 may be dedicated to shorter-range wireless communications such as Wi-Fi or Bluetooth, and a second communication component 612 may be dedicated to longer-range wireless communications such as global positioning system (GPS), EDGE, GPRS, CDMA, WiMAX, LTE, EV-DO, or others. In some embodiments, a first communication component 612 may be dedicated to wireless communications, and a second communication component 612 may be dedicated to wired communications.

The electrical device 600 may include battery/power circuitry 614. The battery/power circuitry 614 may include one or more energy storage devices (e.g., batteries or capacitors) and/or circuitry for coupling components of the electrical device 600 to an energy source separate from the electrical device 600 (e.g., AC line power).

The electrical device 600 may include a display device 606 (or corresponding interface circuitry, as discussed above). The display device 606 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 600 may include an audio output device 608 (or corresponding interface circuitry, as discussed above). The audio output device 608 may include any embedded or wired or wirelessly connected external device that generates an audible indicator, such speakers, headsets, or earbuds.

The electrical device 600 may include an audio input device 624 (or corresponding interface circuitry, as discussed above). The audio input device 624 may include any embedded or wired or wirelessly connected device that generates a signal representative of a sound, such as microphones, microphone arrays, or digital instruments (e.g., instruments having a musical instrument digital interface (MIDI) output). The electrical device 600 may include a Global Navigation Satellite System (GNSS) device 618 (or corresponding interface circuitry, as discussed above), such as a Global Positioning System (GPS) device. The GNSS device 618 may be in communication with a satellite-based system and may determine a geolocation of the electrical device 600 based on information received from one or more GNSS satellites, as known in the art.

The electrical device 600 may include another output device 610 (or corresponding interface circuitry, as discussed above). Examples of the other output device 610 may include an audio codec, a video codec, a printer, a wired or wireless transmitter for providing information to other devices, or an additional storage device.

The electrical device 600 may include another input device 620 (or corresponding interface circuitry, as discussed above). Examples of the other input device 620 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 600 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra-mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 600 may be any other electronic device that processes data. In some embodiments, the electrical device 600 may comprise multiple discrete physical components. Given the range of devices that the electrical device 600 can be manifested as in various embodiments, in some embodiments, the electrical device 600 can be referred to as a computing device or a computing system.

Figure 7:
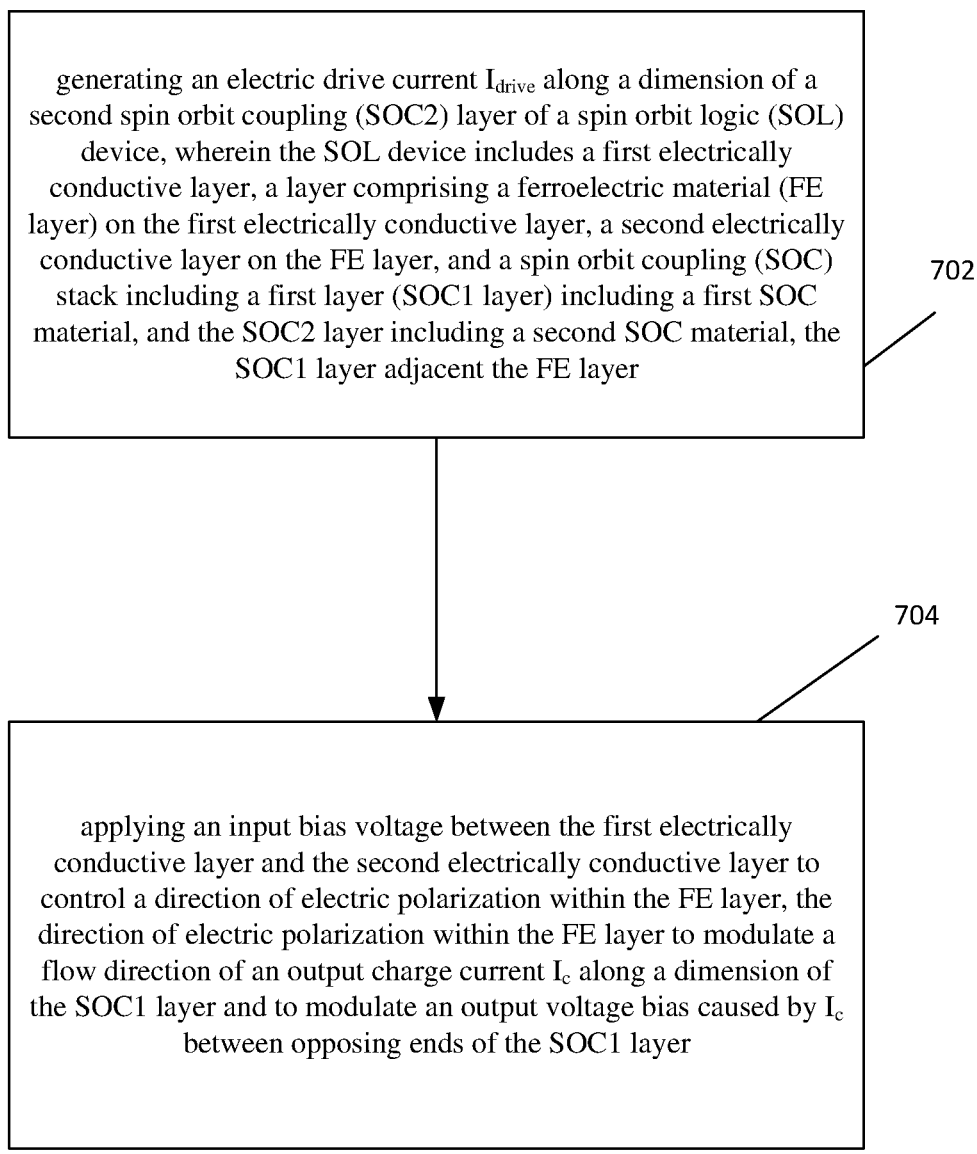
FIG. 7 is a flow chart of a process according to some embodiments.

FIG. 7 is a flow chart of a process 700 according to some embodiments. At operation 702, the process includes generating an electric drive current $I_{drive}$ along a dimension of a second spin orbit coupling (SOC2) layer of a spin orbit logic (SOL) device, wherein the SOL device includes a first electrically conductive layer, a layer comprising a ferroelectric material (FE layer) on the first electrically conductive layer, a second electrically conductive layer on the FE layer, and a spin orbit coupling (SOC) stack including a first layer (SOC1 layer) including a first SOC material, and the SOC2 layer including a second SOC material, the SOC1 layer adjacent the FE layer; at operation 704, the process includes applying an input bias voltage between the first electrically conductive layer and the second electrically conductive layer to control a direction of electric polarization within the FE layer, the direction of electric polarization within the FE layer to modulate a flow direction of an output charge current $I_c$ along a dimension of the SOC1 layer and to modulate an output voltage bias caused by $I_c$ between opposing ends of the SOC1 layer.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of embodiments has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

In embodiments, the phrase "A is located on B" means that at least a part of A is in direct physical contact or indirect physical contact (having one or more other features between A and B) with at least a part of B.

In the instant description, "A is adjacent to B" means that at least part of A is in direct physical contact with at least a part of B.

In the instant description, "B is between A and C" means that at least part of B is in or along a space separating A and C and that the at least part of B is in direct or indirect physical contact with A and C.

In the instant description, "A is attached to B" means that at least part of A is mechanically attached to at least part of B, either directly or indirectly (having one or more other features between A and B).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," "according to some embodiments," "in accordance with embodiments," or "in embodiments," which may each refer to one or more of the same or different embodiments. Furthermore, the terms "comprising," "including," "having," and the like, as used with respect to embodiments of the present disclosure, are synonymous.

"Coupled" as used herein means that two or more elements are in direct physical contact, or that that two or more elements indirectly physically contact each other, but yet still cooperate or interact with each other (i.e. one or more other elements are coupled or connected between the elements that are said to be coupled with each other). The term "directly coupled" means that two or more elements are in direct contact.

As used herein, the term "module" refers to being part of, or including an ASIC, an electronic circuit, a system on a chip, a processor (shared, dedicated, or group), a solid state device, a memory (shared, dedicated, or group) that execute one or more software or firmware programs, a combinational logic circuit, and/or other suitable components that provide the described functionality.

As used herein, "electrically conductive" in some examples may refer to a property of a material having an electrical conductivity greater than or equal to $10^7$ Siemens per meter (S/m) at 20 degrees Celsius. Examples of such materials include Cu, Ag, Al, Au, W, Zn and Ni.

As used herein, an "integrated circuit structure" may include one or more microelectronic dies.

In the corresponding drawings of the embodiments, signals, currents, electrical biases, or magnetic or electrical polarities may be represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, polarity, current, voltage, etc, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the elements that are connected, without any intermediary devices. The term "coupled" means a direct or indirect connection, such as a direct electrical, mechanical, or magnetic connection between the elements that are connected or an indirect connection, through one or more passive or active intermediary devices. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

EXAMPLES

Some non-limiting example embodiments are set forth below.

Example 1 includes a spin orbit logic (SOL) device including: a first electrically conductive layer; a layer comprising a ferroelectric material (FE layer) on the first electrically conductive layer; a second electrically conductive layer on the FE layer; and a spin orbit coupling (SOC) stack including a first layer (SOC1 layer) including a first SOC material, and a second layer (SOC2 layer) including a second SOC material, the SOC1 layer adjacent the FE layer.

Example 2 includes the subject matter of Example 1, wherein, between the first electrically conductive layer and the second electrically conductive layer, the SOL device does not include a ferromagnetic material and does not include a multiferroic material.

Example 3 includes the subject matter of Example 1, wherein the SOC stack includes a layer between the SOC2 layer and the SOC1 layer which does not include an electrically conductive material.

Example 4 includes the subject matter of Example 1, wherein the SOC1 layer is between the FE layer and the SOC2 layer.

Example 5 includes the subject matter of Example 1, further including: a first electrically conductive structure electrically coupled to one end of the SOC2 layer; a second electrically conductive structure electrically coupled to another end of the SOC2 layer, said another end of the SOC2 layer opposite said one end of the SOC2 layer along a dimension of the SOC2 layer; a third electrically conductive structure electrically coupled to one end of the SOC1 layer; and a fourth electrically conductive structure electrically coupled to another end of the SOC1 layer, said another end of the SOC1 layer opposite said one end of the SOC1 layer along a dimension of the SOC1 layer, wherein the dimension of the SOC1 layer is not parallel to the dimension of the SOC2 layer.

Example 6 includes the subject matter of Example 5, wherein the dimension of the SOC1 layer is substantially perpendicular to the dimension of the SOC2 layer.

Example 7 includes the subject matter of any one of Examples 1-6, further including a substrate, wherein the first electrically conductive layer is disposed between the substrate and the FE layer.

Example 8 includes the subject matter of any one of Examples 1-6, wherein at least one of the first SOC material or the second SOC material includes a two-dimensional material (2D material) with spin orbit interaction, wherein the 2D material includes one or more of: Mo, S, W, Se, Graphene, and further wherein the 2D materials includes an absorbent which comprises one or more of: Cu, Ag, Pt, Bi, Fr, or H absorbents.

Example 9 includes the subject matter of any one of Examples 1-6, wherein at least one of the first SOC material or the second SOC material includes R, O and Ch, wherein R includes one or more of: La, Ce, Pr, Nd, Sr, Sc, Ga, Al, or In, and wherein Ch is a chalcogenide which includes one or more of: S, Se, or Te.

Example 10 includes the subject matter of any one of Examples 1-6, wherein at least one of the first SOC material or the second SOC material includes one or more materials that form a hetero-structure with Cu, Ag, Al, and Au.

Example 11 includes the subject matter of any one of Examples 1-6, wherein at least one of the first SOC material or the second SOC material is selected from a group consisting of: $\beta$-Ta, $\beta$-W, W, Pt, Cu doped with Iridium, Cu doped with Bismuth, and Cu doped an element of 3d, 4d, 5d, 4f, or 5f of periodic table groups.

Example 12 includes the subject matter of any one of Examples 1-6, wherein the FE layer includes at least one of $BiFeO_3$, $BaTiO_3$, $Pb[Zr_xTi_{1-x}]O_3$, $LuFeO_3$, or $HfZrO_x$.

Example 13 includes the subject matter of any one of Examples 1-6, wherein the first electrically conductive layer includes Sr, Ru and O.

Example 14 includes the subject matter of Example 7, wherein the substrate includes Si.

Example 15 includes the subject matter of Example 14, further including a buffer layer including Sr, Ru and O buffering the Si.

Example 16 includes the subject matter of any one of Examples 1-6, wherein the tunnel barrier layer includes oxygen.

Example 17 includes the subject matter of any one of Examples 1-6, further including a transistor connected to one of the first electrically conductive structure or the second electrically conductive structure to generate a drive current in the SOC2 layer flowing along the dimension of the SOC2 layer to a corresponding one of the second electrically conductive structure of the first electrically conductive structure.

Example 18 includes an integrated circuit structure comprising: a plurality of spin orbit logic (SOL) devices, wherein individual ones of the SOL devices of the plurality of SOL devices include: a first electrically conductive layer; a layer comprising a ferroelectric material (FE layer) on the first electrically conductive layer; a second electrically conductive layer on the FE layer, the first electrically conductive layer and the second electrically conductive layer corresponding to an input of said individual ones of the SOL devices; and a spin orbit coupling (SOC) stack including a first layer (SOC1 layer) including a first SOC material, and a second layer (SOC2 layer) including a second SOC material, the SOC1 layer adjacent the FE layer, the first SOC material corresponding to an output of said individual ones of the SOL devices; and a plurality of electrically conductive bridges electrically connecting pairs of the individual ones of the SOL devices to one another by electrically connecting an output of a first SOL device of individual ones of the pairs to an input of a second SOL device of the individual ones of the pairs.

Example 19 includes the subject matter of Example 18, wherein, between the first electrically conductive layer and the second electrically conductive layer, the SOL device does not include a ferromagnetic material and does not include a multiferroic material.

Example 20 includes the subject matter of Example 18, wherein the SOC stack includes a layer between the SOC2 layer and the SOC1 layer which does not include an electrically conductive material.

Example 21 includes the subject matter of Example 18, wherein the SOC1 layer is between the FE layer and the SOC2 layer.

Example 22 includes the subject matter of Example 18, further including: a first electrically conductive structure electrically coupled to one end of the SOC2 layer; a second electrically conductive structure electrically coupled to another end of the SOC2 layer, said another end of the SOC2 layer opposite said one end of the SOC2 layer along a dimension of the SOC2 layer; a third electrically conductive structure electrically coupled to one end of the SOC1 layer; and a fourth electrically conductive structure electrically coupled to another end of the SOC1 layer, said another end of the SOC1 layer opposite said one end of the SOC1 layer along a dimension of the SOC1 layer, wherein the dimension of the SOC1 layer is not parallel to the dimension of the SOC2 layer.

Example 23 includes the subject matter of Example 22, wherein the dimension of the SOC1 layer is substantially perpendicular to the dimension of the SOC2 layer.

Example 24 includes the subject matter of any one of Examples 18-23, further including a substrate, wherein the first electrically conductive layer is disposed between the substrate and the FE layer.

Example 25 includes the subject matter of any one of Examples 18-23, wherein at least one of the first SOC material or the second SOC material includes a two-dimensional material (2D material) with spin orbit interaction, wherein the 2D material includes one or more of: Mo, S, W, Se, Graphene, and further wherein the 2D materials includes an absorbent which comprises one or more of: Cu, Ag, Pt, Bi, Fr, or H absorbents.

Example 26 includes the subject matter of any one of Examples 18-23, wherein at least one of the first SOC material or the second SOC material includes R, O and Ch, wherein R includes one or more of: La, Ce, Pr, Nd, Sr, Sc, Ga, Al, or In, and wherein Ch is a chalcogenide which includes one or more of: S, Se, or Te.

Example 27 includes the subject matter of any one of Examples 18-23, wherein at least one of the first SOC material or the second SOC material includes one or more materials that form a hetero-structure with Cu, Ag, Al, and Au.

Example 28 includes the subject matter of any one of Examples 18-23, wherein at least one of the first SOC material or the second SOC material is selected from a group consisting of: $\beta$-Ta, $\beta$-W, W, Pt, Cu doped with Iridium, Cu doped with Bismuth, and Cu doped an element of 3d, 4d, 5d, 4f, or 5f of periodic table groups.

Example 29 includes the subject matter of any one of Examples 18-23, wherein the FE layer includes at least one of $BiFeO_3$, $BaTiO_3$, $Pb[Zr_xTi_{1-x}]O_3$, $LuFeO_3$, or $HfZrO_x$.

Example 30 includes the subject matter of any one of Examples 18-23, wherein the first electrically conductive layer includes Sr, Ru and O.

Example 31 includes the subject matter of Example 24, wherein the substrate includes Si.

Example 32 includes the subject matter of Example 31, further including a buffer layer including Sr, Ru and O buffering the Si.

Example 33 includes the subject matter of any one of Examples 18-23, wherein the tunnel barrier layer includes oxygen.

Example 34 includes the subject matter of any one of Examples 18-23, further including a transistor connected to one of the first electrically conductive structure or the second electrically conductive structure to generate a drive current in the SOC2 layer flowing along the dimension of the SOC2 layer to a corresponding one of the second electrically conductive structure of the first electrically conductive structure.

Example 35 includes an integrated circuit device assembly including: a printed circuit board; and a plurality of integrated circuit components attached to the printed circuit board, individual ones of the integrated circuit components including one or more integrated circuit dies, individual ones of the dies including: a plurality of spin orbit logic (SOL) devices, wherein individual ones of the plurality of SOL devices include: a first electrically conductive layer; a layer comprising a ferroelectric material (FE layer) on the first electrically conductive layer; a second electrically conductive layer on the FE layer, the first electrically conductive layer and the second electrically conductive layer corresponding to an input of said individual ones of the SOL devices; and a spin orbit coupling (SOC) stack including a first layer (SOC1 layer) including a first SOC material, and a second layer (SOC2 layer) including a second SOC material, the SOC1 layer adjacent the FE layer, the first SOC material corresponding to an output of said individual ones of the SOL devices; and a plurality of electrically conductive bridges electrically connecting pairs of the individual ones of the SOL devices to one another by electrically connecting an output of a first SOL device of individual ones of the pairs to an input of a second SOL device of the individual ones of the pairs.

Example 36 includes the subject matter of Example 35, wherein, between the first electrically conductive layer and the second electrically conductive layer, the SOL device does not include a ferromagnetic material and does not include a multiferroic material.

Example 37 includes the subject matter of Example 35, wherein the SOC stack includes a layer between the SOC2 layer and the SOC1 layer which does not include an electrically conductive material.

Example 38 includes the subject matter of Example 35, wherein the SOC1 layer is between the FE layer and the SOC2 layer.

Example 39 includes the subject matter of Example 35, further including: a first electrically conductive structure electrically coupled to one end of the SOC2 layer; a second electrically conductive structure electrically coupled to another end of the SOC2 layer, said another end of the SOC2 layer opposite said one end of the SOC2 layer along a dimension of the SOC2 layer; a third electrically conductive structure electrically coupled to one end of the SOC1 layer; and a fourth electrically conductive structure electrically coupled to another end of the SOC1 layer, said another end of the SOC1 layer opposite said one end of the SOC1 layer along a dimension of the SOC1 layer, wherein the dimension of the SOC1 layer is not parallel to the dimension of the SOC2 layer.

Example 40 includes the subject matter of Example 39, wherein the dimension of the SOC1 layer is substantially perpendicular to the dimension of the SOC2 layer.

Example 41 includes the subject matter of any one of Examples 35-40, further including a substrate, wherein the first electrically conductive layer is disposed between the substrate and the FE layer.

Example 42 includes the subject matter of any one of Examples 35-40, wherein at least one of the first SOC material or the second SOC material includes a two-dimensional material (2D material) with spin orbit interaction, wherein the 2D material includes one or more of: Mo, S, W, Se, Graphene, and further wherein the 2D materials includes an absorbent which comprises one or more of: Cu, Ag, Pt, Bi, Fr, or H absorbents.

Example 43 includes the subject matter of any one of Examples 35-40, wherein at least one of the first SOC material or the second SOC material includes R, O and Ch, wherein R includes one or more of: La, Ce, Pr, Nd, Sr, Sc, Ga, Al, or In, and wherein Ch is a chalcogenide which includes one or more of: S, Se, or Te.

Example 44 includes the subject matter of any one of Examples 35-40, wherein at least one of the first SOC material or the second SOC material includes one or more materials that form a hetero-structure with Cu, Ag, Al, and Au.

Example 45 includes the subject matter of any one of Examples 35-40, wherein at least one of the first SOC material or the second SOC material is selected from a group consisting of: β-Ta, β-W, W, Pt, Cu doped with Iridium, Cu doped with Bismuth, and Cu doped an element of 3d, 4d, 5d, 4f, or 5f of periodic table groups.

Example 46 includes the subject matter of any one of Examples 35-40, wherein the FE layer includes at least one of $BiFeO_3$, $BaTiO_3$, $Pb[Zr_xTi_{1-x}]O_3$, $LuFeO_3$, or $HfZrO_x$.

Example 47 includes the subject matter of any one of Examples 35-40, wherein the first electrically conductive layer includes Sr, Ru and O.

Example 48 includes the subject matter of Example 41, wherein the substrate includes Si.

Example 49 includes the subject matter of Example 31, further including a buffer layer including Sr, Ru and O buffering the Si.

Example 50 includes the subject matter of any one of Examples 35-40, wherein the tunnel barrier layer includes oxygen.

Example 51 includes the subject matter of any one of Examples 18-23, further including a transistor connected to one of the first electrically conductive structure or the second electrically conductive structure to generate a drive current in the SOC2 layer flowing along the dimension of the SOC2 layer to a corresponding one of the second electrically conductive structure of the first electrically conductive structure.

Example 52 method of performing a logic operation using an integrated circuit structure including a spin orbit logic (SOC) device, the SOL device including a first electrically conductive layer, a layer comprising a ferroelectric material (FE layer) on the first electrically conductive layer, a second electrically conductive layer on the FE layer, and a spin orbit coupling (SOC) stack including a first layer (SOC1 layer) including a first SOC material, and a second layer (SOC2 layer) including a second SOC material, the SOC1 layer adjacent the FE layer, the method including: generating an electric drive current Tame along a dimension of the SOC2 layer; and applying an input bias voltage between the first electrically conductive layer and the second electrically conductive layer to control a direction of electric polarization within the FE layer, the direction of electric polarization within the FE layer to modulate a flow direction of an output charge current $I_c$ along a dimension of the SOC1 layer and to modulate an output voltage bias caused by $I_c$ between opposing ends of the SOC1 layer.

Example 53 includes the subject matter of Example 52, wherein generating Tame includes applying a drive bias voltage between two opposing ends of the SOC2 layer.

Example 54 includes the subject matter of Example 52, wherein the SOL device is a first SOL device, $I_c$ is $I_{c1}$, and the integrated circuit structure includes a second SOL device electrically coupled to the first SOL device, the method further including applying the output voltage bias of the first SOL device as an input bias voltage between a first electrically conductive layer and a second electrically conductive layer of the second SOL device to control a direction of electric polarization within a FE layer of the second SOL device, the direction of electric polarization within the FE layer of the second SOL device to modulate a flow direction of an output charge current $I_{c2}$ along a dimension of a SOC1 layer of the second SOL device and to modulate an output voltage bias caused by $I_{c2}$ between opposing ends of the SOC1 layer of the second SOL device.

Example 55 includes the subject matter of the any of the Examples above, wherein the first SOC material and the second SOC material are different from one another.

What is claimed is:

1. A spin orbit logic (SOL) device including:
   a first electrically conductive layer;
   a layer comprising a ferroelectric material (FE layer) on the first electrically conductive layer;
   a second electrically conductive layer on the FE layer, wherein, between the first electrically conductive layer and the second electrically conductive layer, the SOL device does not include a ferromagnetic material and does not include a multiferroic material; and
   a spin orbit coupling (SOC) stack including a first layer (SOC1 layer) including a first SOC material, and a second layer (SOC2 layer) including a second SOC material, the SOC1 layer adjacent the FE layer.

2. The SOL device of claim 1, wherein the SOC stack includes a layer between the SOC2 layer and the SOC1 layer which does not include an electrically conductive material.

3. The SOL device of claim 1, wherein the SOC1 layer is between the FE layer and the SOC2 layer.

4. The SOL device of claim 1, further including:
   a first electrically conductive structure electrically coupled to one end of the SOC2 layer;
   a second electrically conductive structure electrically coupled to another end of the SOC2 layer, said another end of the SOC2 layer opposite said one end of the SOC2 layer along a dimension of the SOC2 layer;
   a third electrically conductive structure electrically coupled to one end of the SOC1 layer; and
   a fourth electrically conductive structure electrically coupled to another end of the SOC1 layer, said another end of the SOC1 layer opposite said one end of the SOC1 layer along a dimension of the SOC1 layer, wherein the dimension of the SOC1 layer is not parallel to the dimension of the SOC2 layer.

5. The SOL device of claim 4, wherein the dimension of the SOC1 layer is substantially perpendicular to the dimension of the SOC2 layer.

6. The SOL device of claim 1, further including a substrate, wherein the first electrically conductive layer is disposed between the substrate and the FE layer.

7. The SOL device of claim 1, wherein at least one of the first SOC material or the second SOC material includes a two-dimensional material (2D material) with spin orbit interaction, wherein the 2D material includes one or more of: Mo, S, W, Se, Graphene, and further wherein the 2D materials includes an absorbent which comprises one or more of: Cu, Ag, Pt, Bi, Fr, or H absorbents.

8. The SOL device of claim 1, wherein at least one of the first SOC material or the second SOC material includes R, O and Ch, wherein R includes one or more of: La, Ce, Pr, Nd, Sr, Sc, Ga, Al, or In, and wherein Ch is a chalcogenide which includes one or more of: S, Se, or Te.

9. The SOL device of claim 1, wherein at least one of the first SOC material or the second SOC material includes one or more materials that form a hetero-structure with Cu, Ag, Al, and Au.

10. The SOL device of claim 1, wherein at least one of the first SOC material or the second SOC material is selected from a group consisting of: β-Ta, β-W, W, Pt, Cu doped with Iridium, Cu doped with Bismuth, and Cu doped an element of 3d, 4d, 5d, 4f, or 5f of periodic table groups.

11. The SOL device of claim 1, wherein the FE layer includes at least one of $BiFeO_3$, $BaTiO_3$, $Pb[Zr_xTi_{1-x}]O_3$, $LuFeO_3$, or $HfZrO_x$.

12. The SOL device of claim 1, further including a transistor connected to one of the first electrically conductive layer or the second electrically conductive layer to generate a drive current in the SOC2 layer flowing along the dimension of the SOC2 layer to a corresponding one of the second electrically conductive structure of the first electrically conductive structure.

13. The SOL device of claim 1, wherein the first SOC material and the second SOC material are different from one another.

14. An integrated circuit structure comprising:
a plurality of spin orbit logic (SOL) devices, wherein individual ones of the SOL devices of the plurality of SOL devices include:
a first electrically conductive layer;
a layer comprising a ferroelectric material (FE layer) on the first electrically conductive layer;
a second electrically conductive layer on the FE layer, the first electrically conductive layer and the second electrically conductive layer corresponding to an input of said individual ones of the SOL devices; and
a spin orbit coupling (SOC) stack including a first layer (SOC1 layer) including a first SOC material, and a second layer (SOC2 layer) including a second SOC material, the SOC1 layer adjacent the FE layer, the first SOC material corresponding to an output of said individual ones of the SOL devices; and
a plurality of electrically conductive bridges electrically connecting pairs of the individual ones of the SOL devices to one another by electrically connecting an output of a first SOL device of individual ones of the pairs to an input of a second SOL device of the individual ones of the pairs.

15. The integrated circuit structure of claim 14, wherein, between the first electrically conductive layer and the second electrically conductive layer, the SOL device does not include a ferromagnetic material and does not include a multiferroic material.

16. The integrated circuit structure of claim 14, wherein the SOC stack includes a layer between the SOC2 layer and the SOC1 layer which does not include an electrically conductive material.

17. The integrated circuit structure of claim 14, wherein the first SOC material and the second SOC material are different from one another.

18. The integrated circuit structure of claim 14, further including:
a first electrically conductive structure electrically coupled to one end of the SOC2 layer;
a second electrically conductive structure electrically coupled to another end of the SOC2 layer, said another end of the SOC2 layer opposite said one end of the SOC2 layer along a dimension of the SOC2 layer;
a third electrically conductive structure electrically coupled to one end of the SOC1 layer; and
a fourth electrically conductive structure electrically coupled to another end of the SOC1 layer, said another end of the SOC1 layer opposite said one end of the SOC1 layer along a dimension of the SOC1 layer, wherein the dimension of the SOC1 layer is not parallel to the dimension of the SOC2 layer.

19. The integrated circuit structure of claim 14, wherein at least one of the first SOC material or the second SOC material includes a two-dimensional material (2D material) with spin orbit interaction, wherein the 2D material includes one or more of: Mo, S, W, Se, Graphene, and further wherein the 2D materials includes an absorbent which comprises one or more of: Cu, Ag, Pt, Bi, Fr, or H absorbents.

20. The integrated circuit structure of claim 14, wherein at least one of the first SOC material or the second SOC material includes R, O and Ch, wherein R includes one or more of: La, Ce, Pr, Nd, Sr, Sc, Ga, Al, or In, and wherein Ch is a chalcogenide which includes one or more of: S, Se, or Te.

21. An integrated circuit device assembly including:
a printed circuit board; and
a plurality of integrated circuit components attached to the printed circuit board, individual ones of the integrated circuit components including one or more integrated circuit dies, individual ones of the dies including:
a plurality of spin orbit logic (SOL) devices, wherein individual ones of the plurality of SOL devices include:
a first electrically conductive layer;
a layer comprising a ferroelectric material (FE layer) on the first electrically conductive layer;
a second electrically conductive layer on the FE layer, the first electrically conductive layer and the second electrically conductive layer corresponding to an input of said individual ones of the SOL devices; and
a spin orbit coupling (SOC) stack including a first layer (SOC1 layer) including a first SOC material, and a second layer (SOC2 layer) including a second SOC material, the SOC1 layer adjacent the FE layer, the first SOC material corresponding to an output of said individual ones of the SOL devices; and
a plurality of electrically conductive bridges electrically connecting pairs of the individual ones of the SOL devices to one another by electrically connecting an output of a first SOL device of individual ones of the pairs to an input of a second SOL device of the individual ones of the pairs.

22. The integrated circuit device assembly of claim 21, wherein, between the first electrically conductive layer and the second electrically conductive layer, the SOL device does not include a ferromagnetic material and does not include a multiferroic material, and wherein the first SOC material and the second SOC material are different from one another.

23. The integrated circuit device assembly of claim 21, wherein the SOC stack includes a layer between the SOC2 layer and the SOC1 layer which does not include an electrically conductive material.

24. The integrated circuit device assembly of claim 21, further including:
a first electrically conductive structure electrically coupled to one end of the SOC2 layer;
a second electrically conductive structure electrically coupled to another end of the SOC2 layer, said another end of the SOC2 layer opposite said one end of the SOC2 layer along a dimension of the SOC2 layer;
a third electrically conductive structure electrically coupled to one end of the SOC1 layer; and
a fourth electrically conductive structure electrically coupled to another end of the SOC1 layer, said another end of the SOC1 layer opposite said one end of the SOC1 layer along a dimension of the SOC1 layer, wherein the dimension of the SOC1 layer is not parallel to the dimension of the SOC2 layer.

* * * * *